(12) United States Patent
Kwak et al.

(10) Patent No.: US 8,871,426 B2
(45) Date of Patent: Oct. 28, 2014

(54) PHOTORESIST COMPOSITION FOR COLOR FILTER AND METHOD FOR FORMING COLOR FILTER

(75) Inventors: Chang-Hun Kwak, Suwon-si (KR); Chul Huh, Yongin-si (KR); Myung Jin Lee, Hwaseong-si (KR); Min-Jung Kang, Incheon (KR)

(73) Assignee: Samsung Display Co., Ltd. (KR)

( * ) Notice: Subject to any disclaimer, the term of this patent is extended or adjusted under 35 U.S.C. 154(b) by 145 days.

(21) Appl. No.: 13/430,542

(22) Filed: Mar. 26, 2012

(65) Prior Publication Data
US 2013/0065167 A1    Mar. 14, 2013

(30) Foreign Application Priority Data

Sep. 8, 2011    (KR) .................. 10-2011-0091020

(51) Int. Cl.
| | | |
|---|---|---|
| G03C 1/00 | (2006.01) | |
| G03F 7/00 | (2006.01) | |
| G03F 7/033 | (2006.01) | |
| G03F 7/105 | (2006.01) | |
| G03F 7/40 | (2006.01) | |
| G03F 7/075 | (2006.01) | |

(52) U.S. Cl.
CPC .............. *G03F 7/0007* (2013.01); *G03F 7/033* (2013.01); *G03F 7/105* (2013.01); *G03F 7/40* (2013.01); *G03F 7/0758* (2013.01)
USPC .......................................... 430/270.1; 430/7

(58) Field of Classification Search
USPC .................. 430/7, 270.1, 281.1, 283.1, 285.1
See application file for complete search history.

(56) References Cited

U.S. PATENT DOCUMENTS

| | | | |
|---|---|---|---|
| 6,120,852 A | 9/2000 | Porter | |
| 6,806,032 B2* | 10/2004 | Takanashi et al. | ......... 430/288.1 |
| 7,445,848 B2 | 11/2008 | Nixon | |
| 7,611,998 B2 | 11/2009 | Jackson et al. | |
| 7,705,086 B2 | 4/2010 | Lu et al. | |
| 2003/0170569 A1* | 9/2003 | Takanashi et al. | ......... 430/285.1 |
| 2008/0254394 A1* | 10/2008 | Kobayashi et al. | ........... 430/322 |
| 2009/0048394 A1 | 2/2009 | Gommans et al. | |
| 2010/0080973 A1 | 4/2010 | Son et al. | |

FOREIGN PATENT DOCUMENTS

| | | |
|---|---|---|
| JP | 11-106661 A | 4/1999 |
| JP | 11-228825 A | 8/1999 |
| JP | 3215943 A | 8/2001 |
| JP | 2004-283157 A | 10/2004 |
| JP | 2007-132892 A | 5/2007 |
| JP | 2008-197545 A | 8/2008 |
| JP | 2008-208342 A | 9/2008 |
| JP | 2008-308694 A | 12/2008 |
| JP | 2010-006982 A | 1/2010 |
| JP | 2010-222559 A | 10/2010 |
| JP | 2011-016965 A | 1/2011 |
| KR | 1020080068246 A | 7/2008 |
| KR | 1020090106277 A | 10/2009 |

\* cited by examiner

*Primary Examiner* — Stewart Fraser
(74) *Attorney, Agent, or Firm* — Innovation Counsel LLP

(57) ABSTRACT

A photoresist composition for a color filter is provided which includes a) a coloring agent, b) a binder resin, c) a photopolymerization initiator, d) a photopolymerizable monomer, and e) a solvent, wherein a siloxane-based material is bonded to the binder resin.

6 Claims, 5 Drawing Sheets

PHOTORESIST COMPOSITION FOR COLOR FILTER AND METHOD FOR FORMING COLOR FILTER

CROSS-REFERENCE TO RELATED APPLICATION

This application claims priority to and the benefit of Korean Patent Application No. 10-2011-0091020 filed in the Korean Intellectual Property Office on Sep. 8, 2011, the entire contents of which are incorporated herein by reference.

BACKGROUND OF THE INVENTION (a) Field of the Invention

The present invention relates to a photoresist composition for a color filter and a method for forming a color filter.

(b) Description of the Related Art

Among the various techniques for forming a color filter, there is a method for coating a photoresist for a color filter on a substrate and curing the photoresist.

The photoresist typically contains at least a binder resin and a polyfunctional monomer. The photoresist is first photocured, then thermally cured at a high temperature of 230° C. or more. Since coloring agents including dyes have poorer heat resistance than pigments, however, and since the shape of the substrate used in a recently developed flexible display is deformed by heat, there are problems in thermal curing at high temperature.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a photoresist composition for a color filter that can be cured at a low temperature and a method for forming a color filter.

An exemplary embodiment of the present invention provides a photoresist composition for a color filter, including: a) a coloring agent, b) a binder resin, c) a photopolymerization initiator, d) a photopolymerizable monomer, and e) a solvent, wherein a siloxane-based material is bonded to the binder resin.

The siloxane-based material may be represented by the following Formula 1.

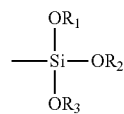

[Formula 1]

$R_1$, $R_2$, and $R_3$ are each independently selected from the group consisting of hydrogen (H), $NO_2$, OH, and an alkyl group.

The coloring agent may include a dye-based material.

The dye-based coloring agent may be bonded to the binder resin.

A siloxane-based material may be bonded to the photopolymerizable monomer.

The dye-based coloring agent may be at least one selected from the group consisting of the compounds represented by the following Formula A to Formula K.

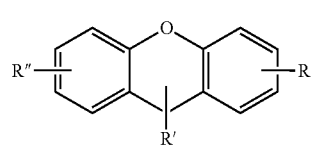
[Formula A]

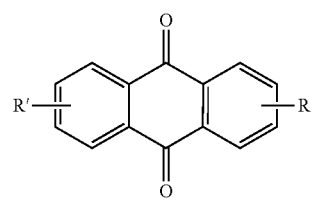
[Formula B]

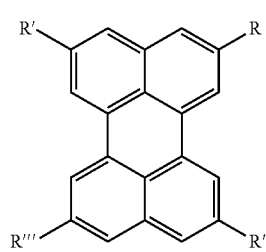
[Formula C]

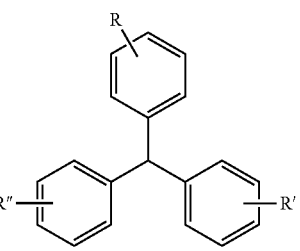
[Formula D]

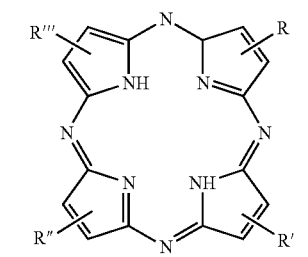
[Formula E]

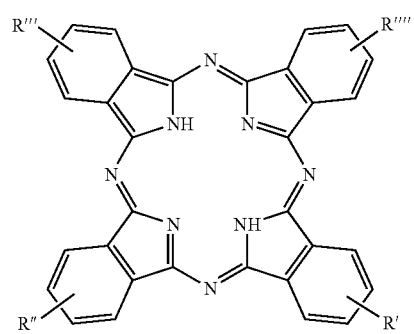
[Formula F]

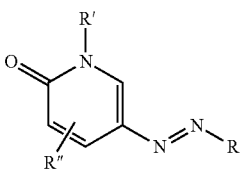
[Formula G]

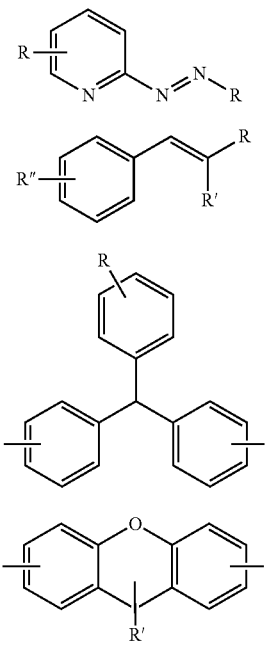

Herein, R', R", R''', and R'''' each independently includes at least one selected from the group consisting of an alkyl group, a nitro group, a carbonyl group, an azo group, —C≡C—, —C≡N—, —C≡S—, —N≡O—, —OH, —NH$_2$, and —COOH.

The binder resin to which the siloxane-based material is bonded may be cured at a temperature of 200° C. or less.

Another exemplary embodiment of the present invention provides a method for forming a color filter, including: forming a photoresist for a color filter, coating the photoresist on a substrate, exposing the photoresist, and thermally curing the photoresist, wherein the photoresist includes a) a coloring agent, b) a binder resin, c) a photopolymerization initiator, d) a photopolymerizable monomer, and e) a solvent, and a siloxane-based material is bonded to the binder resin.

The thermal curing of the photoresist may be performed at a temperature of 200° C. or less.

The coloring agent may include a dye-based material. A "dye-based material," as used herein, includes coloring agents that use dyes.

The forming of the photoresist may include chemically bonding monomers of the dye-based coloring agent and the binder resin.

The forming of the photoresist may include chemically bonding a siloxane-based material to the photopolymerizable monomer.

The forming of the photoresist may include chemically bonding the siloxane-based material to a monomer of the binder resin.

According to exemplary embodiments of the present invention, it is possible to cure a photoresist for a color filter at a low temperature by bonding a siloxane-based material including a functional group having strong reactivity to a binder resin and a photopolymerizable monomer participating in a curing system.

DETAILED DESCRIPTION OF THE EMBODIMENTS

Figure 1:
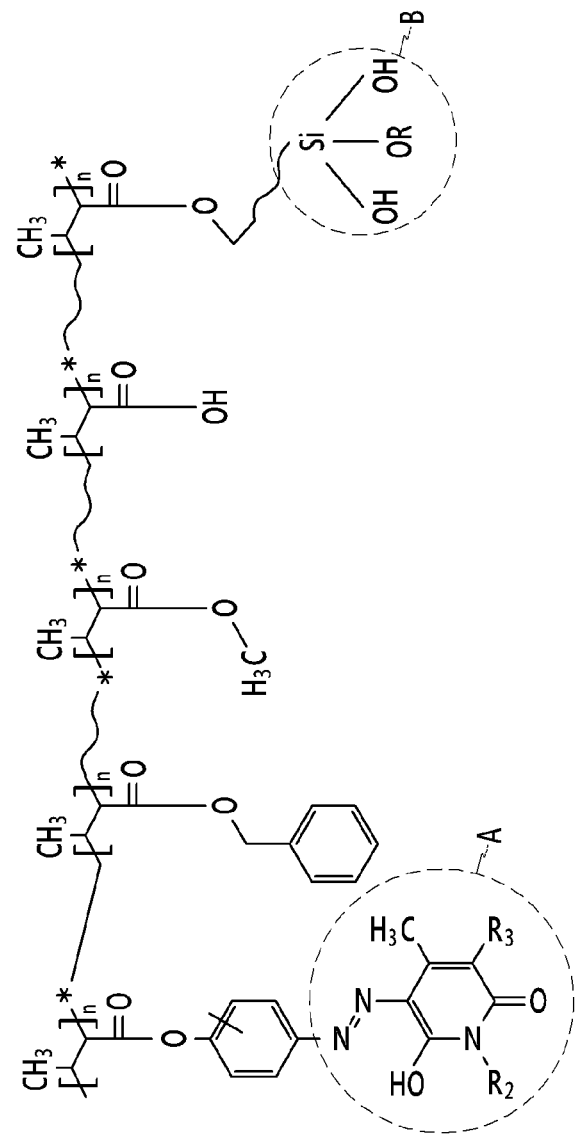
FIG. 1 is a structural formula illustrating a binder resin according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. On the contrary, exemplary embodiments introduced herein are provided to make disclosed contents thorough and complete and sufficient transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or intervening layers may also be present. Like reference numerals designate like elements throughout the specification.

A photoresist composition for a color filter according to an exemplary embodiment includes a) a coloring agent, b) a binder resin, c) a photopolymerization initiator, d) a photopolymerizable monomer, and e) a solvent, wherein a siloxane-based material is included in the binder resin. By thoroughly curing the binder resin at a low temperature by —OH and —OR groups having the large reactivity of the siloxane-based material, an intrinsic characteristic of a coloring agent may be maintained by curing a dye-based photoresist at a low temperature.

Since coloring agents, including dyes, have poorer heat resistance than pigments, dyes' physical properties and intrinsic characteristics may deteriorate when exposed to high temperatures. In addition, there is a problem of the shape of a substrate used in a flexible display being deformed by heat. In the case where a color filter is formed by using the photoresist composition according to the present exemplary embodiment, however, the curing occurs at a low temperature, such that the above problems are avoided or solved.

Figure 2:
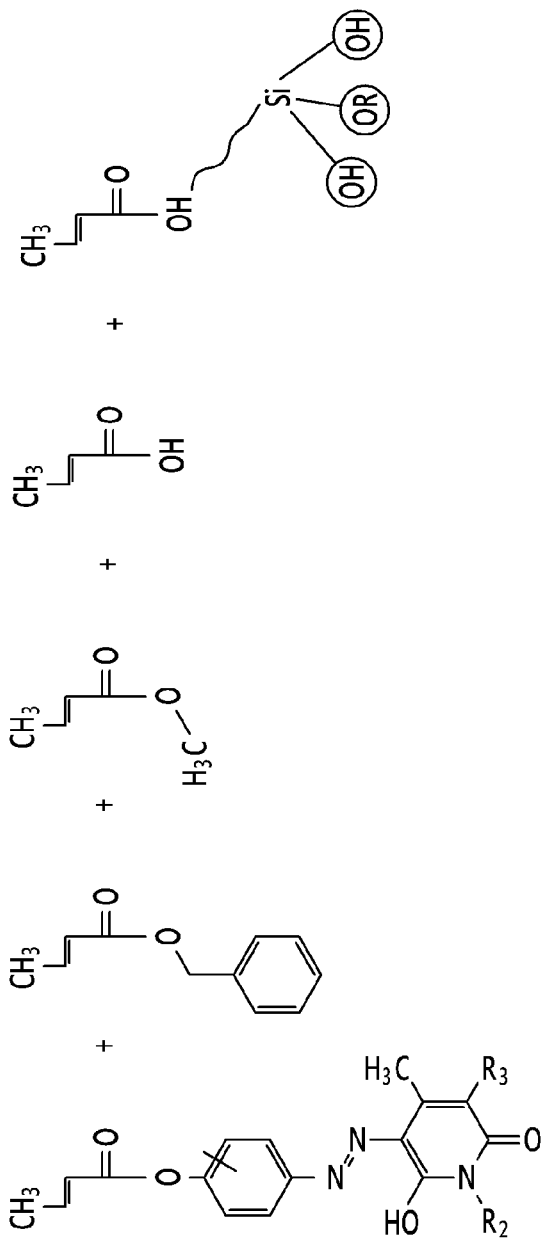
FIG. 2 is a structural formula illustrating a step for forming a binder resin according to an exemplary embodiment of the present invention.

FIG. 1 is a structural formula illustrating a binder resin according to an exemplary embodiment of the present invention. FIG. 2 is a structural formula illustrating a step for forming a binder resin according to an exemplary embodiment of the present invention.

In the exemplary embodiment, a siloxane-based material is represented by the following Formula 1.

[Formula 1]

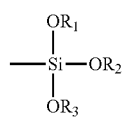

In Formula 1, R1, R2, and R3 may be selected from the group consisting of hydrogen (H), NO2, OH, and an alkyl group.

In describing the binder resin according to the exemplary embodiment, the binder resin included in the photoresist composition may be bonded to a dye material such as A represented in FIG. 1 and the siloxane-based material such as B. Referring to FIG. 2, in a process for preparing the binder resin before curing the photoresist, a monomer including the dye material or siloxane-based material may be formed by bonding a monomer that is a basic unit of the binder resin and the dye material or a monomer that is a basic unit of the binder resin and the siloxane-based material through a chemical reaction. In addition, the binder resin to which the dye or siloxane-based material is bonded may be formed by copolymerizing the monomers that are the basic unit of the binder resin with the monomer to which the dye material is bonded and the monomer to which the siloxane-based material is chemically bonded.

In the exemplary embodiment, the dye is covalently bonded to the binder resin because if the dye is in an independent state, a bonding state is easily broken by heat, such that a color characteristic may not be exhibited.

The dye that may be bonded to the A position in the binder resin shown in FIG. 1 may be any one of the compounds represented by the following Formula A to Formula K. In the following Formula A to Formula K, R', R", R''', and R'''' each includes at least one selected from the group consisting of an alkyl group, a nitro group, a carbonyl group, an azo group, —C=C—, —C=N—, —C=S—, —N=O—, —OH, —NH$_2$, and —COOH.

[Formula A]

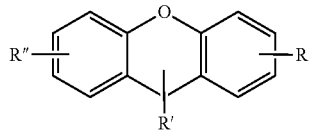

[Formula B]

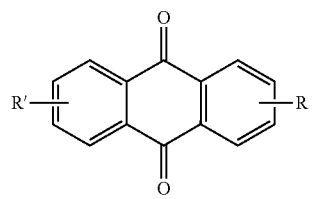

[Formula C]

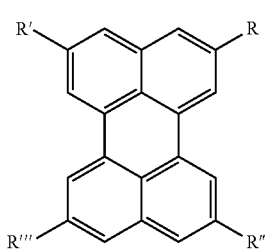

[Formula D]

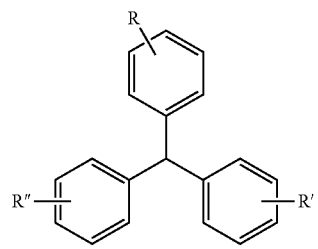

[Formula E]

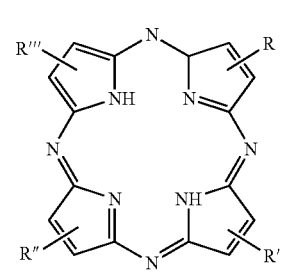

[Formula F]

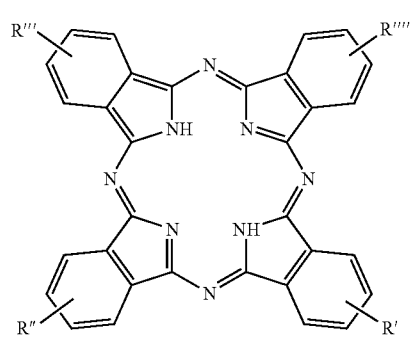

[Formula G]

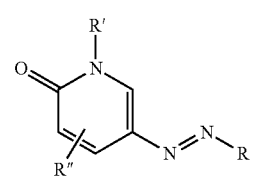

[Formula H]

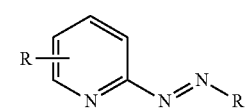

[Formula I]

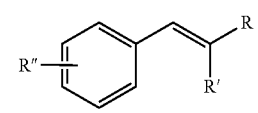

[Formula J]

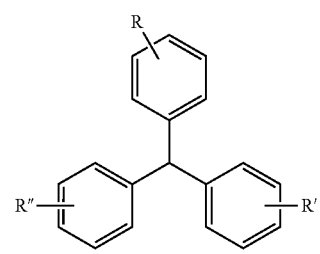

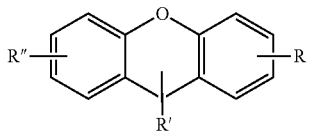

[Formula K]

Herein, R', R", R''', and R'''' include at least one selected from the group consisting of an alkyl group, a nitro group, a carbonyl group, an azo group, —C=C—, —C=N—, —C=S—, —N=O—, —OH, —NH₂, and —COOH.

Figure 3:
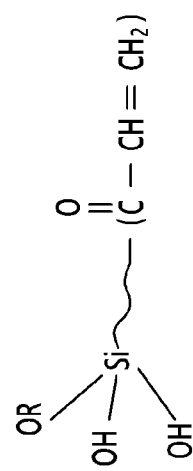
FIG. 3 is a structural formula illustrating a photopolymerizable monomer according to another exemplary embodiment of the present invention.
Figure 4:
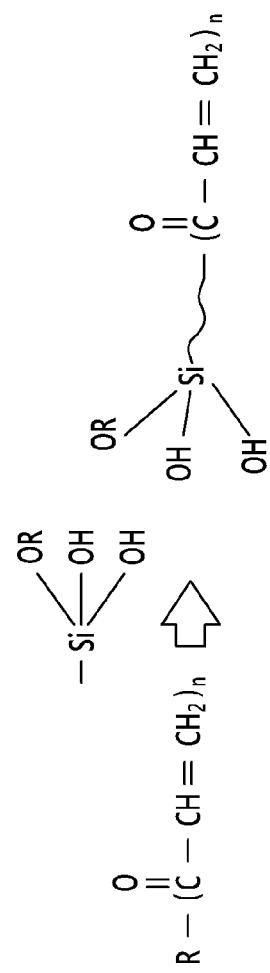
FIG. 4 is a structural formula illustrating a step for forming a photopolymerizable monomer according to another exemplary embodiment of the present invention.

FIG. 3 is a structural formula illustrating a photopolymerizable monomer according to another exemplary embodiment of the present invention. FIG. 4 is a structural formula illustrating a step for forming a photopolymerizable monomer according to another exemplary embodiment of the present invention.

In another exemplary embodiment of the present invention, the siloxane-based material may be bonded to the photopolymerizable monomer, as shown in FIG. 3. Herein, the photopolymerizable monomer is a polyfunctional monomer, and functions to form a residual film of the photoresist by performing photocuring or thermal curing.

Referring to FIG. 4, in the process for preparing the photoresist before curing the photoresist, the photopolymerizable monomer and the siloxane-based material are chemically bonded.

As described above, if the siloxane-based material is bonded to the binder resin and the photopolymerizable monomer, low temperature thermal curing may easily occur between the —OH and —OR groups having high reactivity.

A pigment-based coloring agent, a dye-based coloring agent or a hybrid-based coloring agent in which a pigment and a dye are mixed with each other may be applied to photoresist composition according to the exemplary embodiment. Particularly, when a dye-based coloring agent having poor heat resistance is applied to the photoresist composition, an effect of low temperature thermal curing is large.

After the photoresist composition is exposed, the thermal curing is performed, and double bonds included in the binder resin and the photopolymerizable monomer are crosslinked by the exposure. All the binder resin and the photopolymerizable monomer react on light according to the exposure, but remain while being not completely cured, such that the final curing of the photoresist is performed by progressing the thermal curing. In this case, the binder resin affects a development property, and partially affects formation of the residual film.

EXPERIMENTAL EXAMPLE 1

The siloxane-based material was bonded to the binder resin, the photoresist composition including the dye type coloring agent, initiator, photopolymerizable monomer, and solvent was coated on the substrate, and hardness was measured according to the temperature at a predetermined time interval. The results are described in the following Table 1.

TABLE 1

| Classification | 190° C. | | | 210° C. | | 230° C. | |
|---|---|---|---|---|---|---|---|
| | 1 min | 5 min | 10 min | 5 min | 10 min | 5 min | 10 min |
| Hardness | 3H | 5H | 6H | 6H | 6H | 6H | 6H |

In reviewing Table 1, when the thermal curing condition was 190° C. or more and 5 min or more, a hardness of 5H or more was obtained. That is, if the photoresist composition for a color filter according to the exemplary embodiment is used, it can be seen that the curing can be performed at a temperature of about 200° C. or less.

EXPERIMENTAL EXAMPLE 2

After the green color filter was formed by using the photoresist composition including the binder resin to which the siloxane-based material is bonded, the polyfunctional monomer to which the siloxane-based material is bonded, initiator, and solvent, the color coordinate value was measured by the weighing.

In the following Table 2, the Comparative Examples show that the photoresist composition including the binder resin to which the siloxane-based material is not bonded, the monomer, and the coloring agent is cured at 230° C. according to the known art, and as described above the Examples show that the photoresist composition including the binder resin to which the siloxane-based material is bonded or the coloring agent to which the siloxane-based material is bonded is cured at 200° C.

TABLE 2

| | GY value | Gx value | Gy value |
|---|---|---|---|
| Comparative Example | 61.19 | 0.2882 | 0.5758 |
| | 63.06 | 0.2912 | 0.5659 |
| | 64.39 | 0.2935 | 0.5586 |
| Average value | 62.65 | 0.2906 | 0.5680 |
| Example | 63.89 | 0.2860 | 0.5726 |
| | 65.84 | 0.2898 | 0.5627 |
| | 67.62 | 0.2936 | 0.5520 |
| Average value | 65.14 | 0.2885 | 0.5660 |

In the case of the RGB color filter, since the green color filter occupied 60% or more of the entire luminance, the measurement was performed on the basis of the green color filter. The Gx value and Gy value measured through the spectrometer show the chroma of the color and are the values showing the degree of darkness, and the GY value is a numerical value showing luminance.

In reviewing Table 2, there was no large difference in the chromas between the Comparative Examples and the Examples, but the GY value showing the luminance of the Example was improved from 62.65 to 65.14 by about 3.97%.

Hereinafter, a method for forming a color filter by using the photoresist composition for the color filter will be described.

Figure 5:
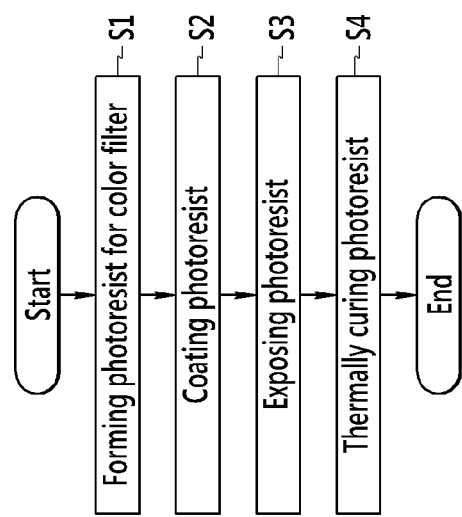
FIG. 5 is a flowchart illustrating a method for forming a color filter according to yet another exemplary embodiment of the present invention.

FIG. 5 is a flowchart illustrating a method for forming a color filter according to yet another exemplary embodiment of the present invention.

Referring to FIG. 5, first, the photoresist for the color filter was formed (S1).

A photoresist according to an exemplary embodiment of the present invention includes a) a coloring agent, b) a binder resin, c) a photopolymerization initiator, d) a photopolymerizable monomer, and e) a solvent, wherein a siloxane-based material is bonded to the binder resin.

The coloring agent may include a dye-based material, and the dye-based coloring agent may be bonded to the binder resin.

In the exemplary embodiment, the siloxane-based material may be represented by the following Formula 1.

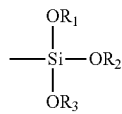
[Formula 1]

In Formula 1, R1, R2, and R3 may be selected from the group consisting of hydrogen (H), NO2, OH, and an alkyl group.

The forming of the photoresist includes chemically bonding the dye-based coloring agent and the siloxane-based material to a monomer that is a basic unit of the binder resin. Thereafter, the forming of the photoresist includes forming the binder resin to which the dye or siloxane-based material is bonded by copolymerizing the monomers that are the basic unit of another binder resin with the monomer to which the dye material is bonded and the monomer to which the siloxane-based material is chemically bonded.

In addition, the forming of the photoresist includes chemically bonding the photopolymerizable monomer and the siloxane-based material.

Thereafter, the photoresist is coated on the substrate (S2).

Thereafter, the photoresist is exposed (S3).

If the photoresist is exposed, the double bonds included in the binder resin and the photopolymerizable monomer are crosslinked. All the binder resin and the photopolymerizable monomer react on light according to the exposure, but remain while being not completely cured, such that the final curing of the photoresist is performed by subsequently progressing the thermal curing.

Thereafter, the photoresist is thermally cured (S4).

The thermal curing of the photoresist may be performed at a temperature of about 200° C. or less. In order to use the dye-based material as the coloring agent, in consideration of heat resistance of the dye, it is necessary to perform the thermal curing at a temperature of 220° C. or less, or 200° C. or less.

As described above, the present invention relates to a photoresist composition for a color filter having a predetermined form, in which a siloxane-based material is bonded to a binder resin or the siloxane-based material is bonded to the binder resin which is bonded to a dye-based coloring agent.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoresist composition for a color filter, comprising:
a) a coloring agent, b) a binder resin, c) a photopolymerization initiator, d) a photopolymerizable monomer, and e) a solvent,
wherein a siloxane-based material is bonded to the binder resin by a silicon-oxygen (Si—O) linkage, and wherein the coloring agent is covalently bonded to the binder resin.

2. The photoresist composition for a color filter of claim 1, wherein:
the siloxane-based material is represented by the following Formula 1:

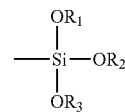
[Formula 1]

(R1, R2, and R3 are each independently selected from the group consisting of hydrogen (H), NO2, OH, and an alkyl group).

3. The photoresist composition for a color filter of claim 2, wherein:
the coloring agent comprises a dye-based material.

4. The photoresist composition for a color filter of claim 1, wherein:
the siloxane-based material is bonded to the photopolymerizable monomer.

5. The photoresist composition for a color filter of claim 4, wherein:
the dye-based coloring agent comprises at least one selected from the group consisting of the compounds represented by the following Formula A, Formula B, Formula C, Formula D, Formula E, Formula F, Formula G, Formula H, and Formula I:

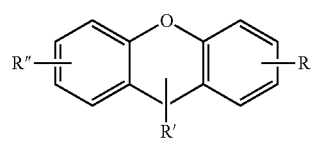
[Formula A]

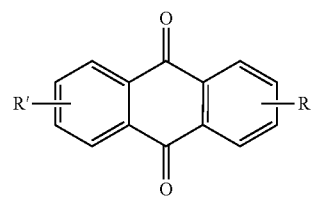
[Formula B]

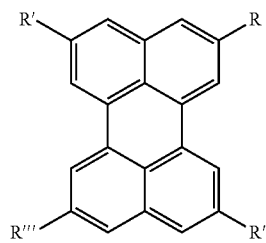
[Formula C]

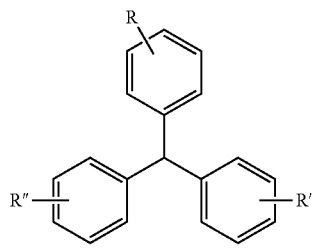
[Formula D]

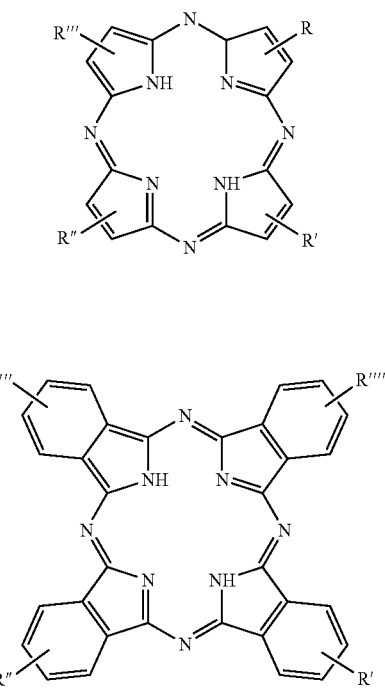
[Formula E]

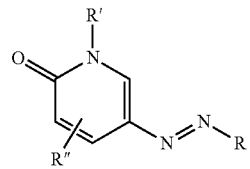
[Formula G]

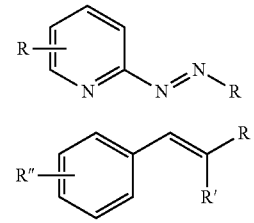
[Formula H]

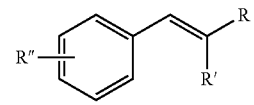
[Formula I]

[Formula F]

(R', R", R''', and R'''' each independently includes at least one selected from the group consisting of an alkyl group, a nitro group, a carbonyl group, an azo group, —C═C—, —C═N—, —C═S—, —N═O—, —OH, —NH₂, and —COOH).

6. The photoresist composition for a color filter of claim 1, wherein: the binder resin to which the siloxane-based material and the coloring agent are bonded is cured at a temperature of 200° C. or less.

* * * * *